(12) United States Patent
Hirano et al.

(10) Patent No.: US 7,038,604 B2
(45) Date of Patent: May 2, 2006

(54) SUPERCONDUCTING MULTI-STAGE SIGMA-DELTA MODULATOR

(75) Inventors: Satoru Hirano, Yamagata (JP); Akira Yoshida, Kanagawa (JP); Sinya Hasuo, Kanagawa (JP); Keiichi Tanabe, Ibaraki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/128,339

(22) Filed: May 13, 2005

(65) Prior Publication Data
US 2005/0253746 A1  Nov. 17, 2005

(30) Foreign Application Priority Data
May 14, 2004  (JP) ............... 2004-145128

(51) Int. Cl.
*H03M 1/00* (2006.01)
*H03M 3/00* (2006.01)

(52) U.S. Cl. ...................... 341/133; 341/143
(58) Field of Classification Search ................ 341/133, 341/143, 155, 171; 327/367, 528; 505/190, 505/702, 832; 365/162; 326/3
See application file for complete search history.

(56) References Cited

U.S. PATENT DOCUMENTS

| | | | | |
|---|---|---|---|---|
| 4,315,255 A | * | 2/1982 | Harris et al. ............... | 341/171 |
| 4,902,908 A | * | 2/1990 | Harada ...................... | 327/367 |
| 5,140,324 A | * | 8/1992 | Przybysz et al. ........... | 341/133 |
| 5,192,951 A | * | 3/1993 | Ko .............................. | 341/133 |
| 5,198,815 A | * | 3/1993 | Przybysz et al. ........... | 341/133 |
| 5,327,130 A | * | 7/1994 | Kang et al. ................. | 341/133 |
| 5,341,136 A | * | 8/1994 | Przybysz et al. ........... | 341/133 |
| 5,400,026 A | * | 3/1995 | Bradley ....................... | 341/133 |
| 5,420,586 A | * | 5/1995 | Radparvar .................. | 341/133 |
| 5,936,458 A | * | 8/1999 | Rylov .......................... | 327/528 |
| 6,608,581 B1 | * | 8/2003 | Semenov .................... | 341/155 |
| 6,750,794 B1 | * | 6/2004 | Durand et al. .............. | 341/133 |
| 6,771,201 B1 | * | 8/2004 | Currie ......................... | 341/155 |

FOREIGN PATENT DOCUMENTS

| | | |
|---|---|---|
| JP | 61177819 A | 8/1986 |
| JP | 2001102929 A | 4/2001 |

OTHER PUBLICATIONS

Satoru Hirano, et al.; "Analytical Calculation of Transfer Function of Superconducting Sigma-Delta Modulator Conversion"; Technical Report of the Institute of Electronics Information and Communication Engineers, SCE2003-27, Oct. 17, 2003.

(Continued)

*Primary Examiner*—Patrick Wamsley
(74) *Attorney, Agent, or Firm*—Arent Fox PLLC

(57) ABSTRACT

There is provided a superconducting multi-stage sigma-delta modulator including a first superconducting sigma-delta modulator having a first integrator and a first comparator and outputting a sigma-delta modulated signal and a second superconducting sigma-delta modulator having a second integrator and a second comparator and outputting a sigma-delta modulated signal. The first integrator and the second integrator are magnetically coupled.

20 Claims, 8 Drawing Sheets

OTHER PUBLICATIONS

John X. Przybysz et al; "Josephson Sigma-Delta Modulator For High Dynamic Range A/D Conversion"; IEEE Transactions on Applied Superconductivity; vol. 3; pp. 2732-2735; Mar. 1993, no date.

Donald L. Miller et al; "Flux Quantum Sigma-Delta Analog-to-Digital Converters for rf Signals"; IEEE Transactions On Applied Superconductivity; vol. 9; pp. 4026-4029; Jun. 1995, no date.

John X. Przybysz et al; "Two-Loop Modulator for Sigma-Delta Analog to Digital Converter"; vol. 5; No. 2; pp. 2248-2251; Jun. 1995 IEEE Transaction on Applied Superconductivity, no date.

* cited by examiner

F I G. 1
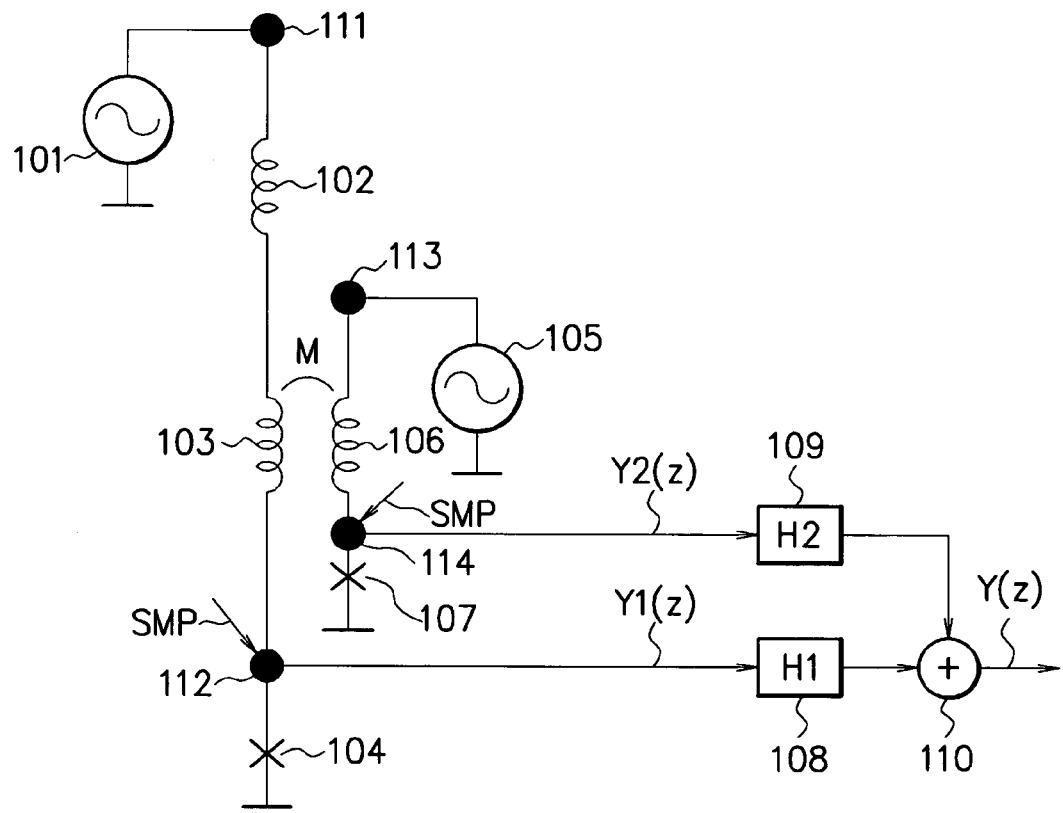

F I G. 2
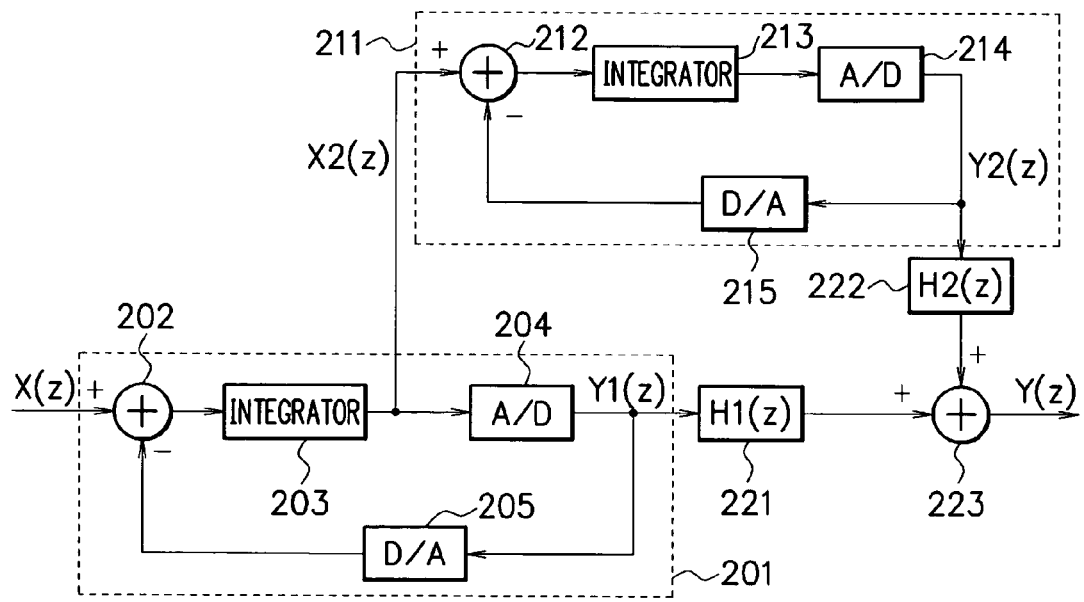

F I G. 3
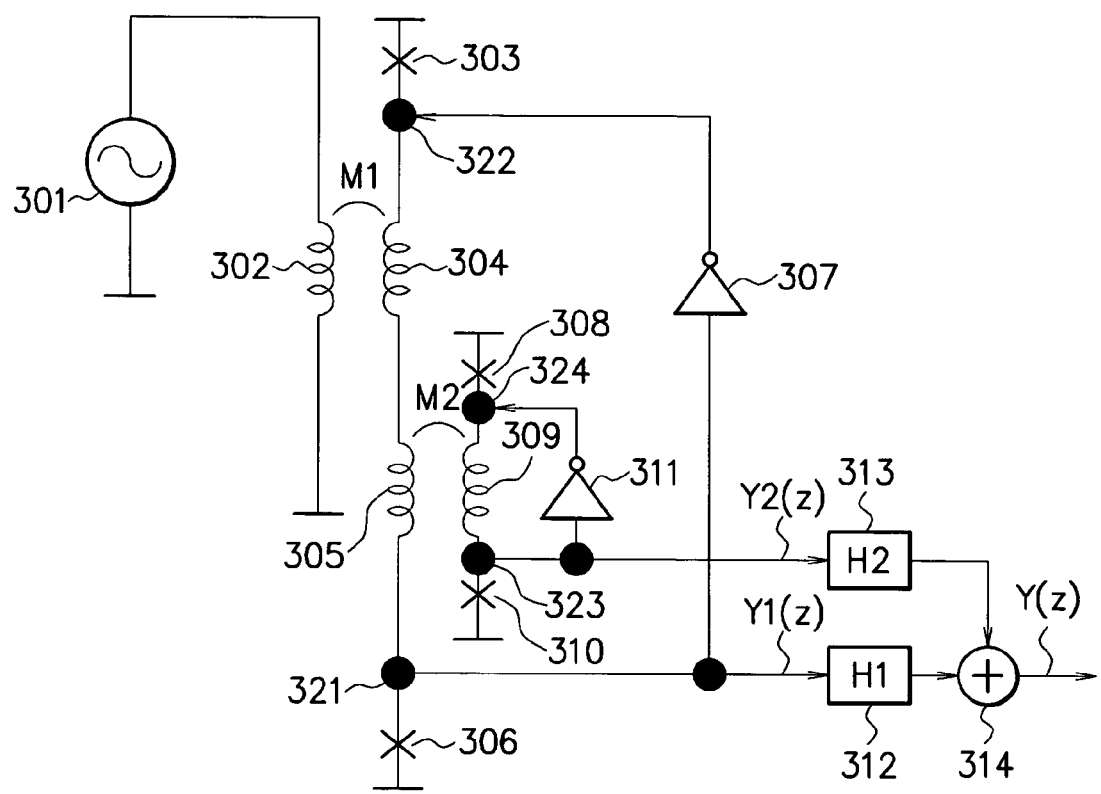

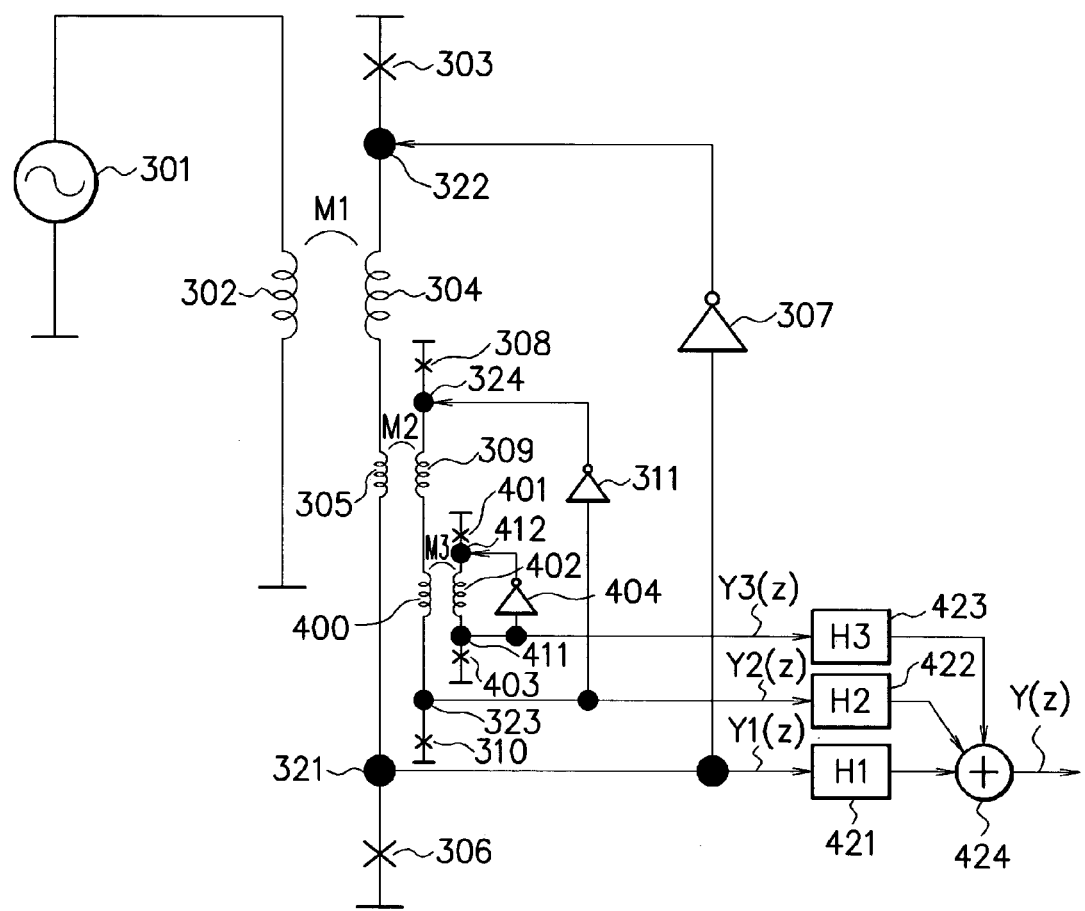
F I G. 4

US 7,038,604 B2

SUPERCONDUCTING MULTI-STAGE SIGMA-DELTA MODULATOR

CROSS-REFERENCE TO RELATED APPLICATIONS

This application is based upon and claims the benefit of priority from the prior Japanese Patent Application No. 2004-145128, filed on May 14, 2004, the entire contents of which are incorporated herein by reference.

BACKGROUND OF THE INVENTION

1. Field of the Invention

The present invention relates to a field of superconducting electronics, and particularly relates to a superconducting sigma-delta modulator.

2. Description of the Related Art

FIG. 6 is a circuit diagram showing a superconducting single-loop sigma-delta modulator described, for example, in the following Non-Patent Document 1. The sigma-delta modulator is a modulator which utilizes an integrating function (sigma) and a differentiating function (delta).

A superconducting inductor 602 is connected between nodes 604 and 605. An input voltage source 601 is connected between the node 604 and a ground. A Josephson junction 603 is connected between the node 605 and the ground. When a sampling clock signal SMP is supplied to the node 605, an output signal Y(z) is output from the node 605.

The input voltage source 601 supplies an input signal to the node 604. The superconducting inductor 602 composes an integrator, and a current obtained by integrating the input signal flows through the superconducting inductor 602. The Josephson junction 603 composes a quantizer and has a property of outputting a voltage pulse corresponding to a digital value "1" when the current flowing through the Josephson junction 603 is larger than a threshold and outputting no voltage pulse corresponding to the digital value "0" when the current is smaller than the threshold. A single flux quantum $\Phi 0$ is obtained by time-integrating this voltage pulse. The single flux quantum $\Phi 0$ is 2.07 fWb and corresponds to a voltage pulse of 2.07 mV·ps. When the Josephson junction 603 outputs the single flux quantum $\Phi 0$, the integrated current flowing through the superconducting inductor 602 is reduced by an amount corresponding to a single flux quantum ($\Phi 0/L$). Here, L is an inductance of the superconducting inductor 602. By performing such single-loop feedback, the sigma-delta modulated signal Y(z) is output. The Josephson junction 603 performs analog to digital (A/D) conversion by quantization in response to the sampling clock signal SMP. The output signal Y(z) becomes a time series of the digital value "1" and "0". By using this sigma-delta modulator, an A/D converter can be constructed.

FIG. 7 shows another superconducting single-loop sigma-delta modulator described, for example, in the following Non-Patent Document 2.

An input current source 701 is connected in series to a superconducting inductor 702. The superconducting inductor 702 is magnetically coupled to a superconducting inductor 704. A Josephson junction 703 is connected between a node 712 and the ground. The superconducting inductor 704 is connected between nodes 712 and 711. A Josephson junction 705 is connected between the node 711 and the ground. An input terminal of a single flux quantum inverter circuit 706 is connected to the node 711, and an output terminal thereof is connected to the node 712. The output signal Y(z) is output from the node 711. Incidentally, similarly to FIG. 6, the sampling clock signal SMP is supplied to the Josephson junction 705 and the single flux quantum inverter circuit 706.

An input signal of the input current source 701 is supplied to the superconducting inductor 704 via mutual inductance M between the superconducting inductors 702 and 704. The superconducting inductor 704 composes an integrator. The Josephson junctions 703 and 705 operate complementarily so as to realize bipolar feedback. For example, when the input signal is maintained at 0 and the Jopsephson junction 705 outputs "0" without outputting the single flux quantum $\Phi 0$, the single flux quantum inverter circuit 706 logically inverts an input signal of "0" and outputs the single flux quantum $\Phi 0$. Then, the Josephson junction 703 outputs the single flux quantum $\Phi 0$. When the Josephson junction 705 outputs the single flux quantum $\Phi 0$, the single flux quantum inverter circuit 706 logically inverts an input signal of the single flux quantum $\Phi 0$ and outputs "0". Then, the Josephson junction 703 outputs "0". As just described, the Josephson junctions 703 and 705 balance a mean voltage at both ends of the inductor 704 while maintaining a complementary relationship. Here, the mean voltage at both ends of the inductor 704 is equal to a mean voltage of the Josephson junctions 703 and 705 and given by $V=f\times\Phi 0$ when the frequency at which the Josephson junctions switch is f[Hz].

As shown in FIG. 6, in the superconducting single-loop sigma-delta modulator, the modulator can be composed of only a set of the superconducting inductor 602 and the Josephson junction 603. In the superconducting sigma-delta modulator, the feedback is one flux quantum $\Phi 0$, and quantum mechanical feedback with a precision of a physical constant can be utilized, whereby high resolution can be expected. It is known that in the single-loop sigma-delta modulator, by first-order noise shaping, the SN ratio improves by 9 dB/octave with an increase of sampling frequency.

On the other hand, in a second-order sigma-delta modulator with second-order noise shaping, the SN ratio improves by 15 dB/octave with an increase of sampling frequency, so that there is an advantage of being able to obtain a high SN ratio without increasing the oversampling ratio considerably, but it has not been easy to realize the second-order sigma-delta modulator by a superconducting single flux quantum (SFQ) circuit. A superconducting second-order low-pass sigma-delta modulator known to date is a double-loop type having two feedback loops.

FIG. 8 is a circuit diagram of a superconducting double-loop sigma-delta modulator, for example, described in Non-Patent Document 3. An input signal X(z) is supplied to a node 801. A resistance R1 is connected between the node 801 and the ground. A series connection of a superconducting inductor L1 and a feedback driver 802 is connected between nodes 801 and 803. A resistance R2 is connected between the node 803 and the ground. A superconducting inductor L2 is connected between nodes 803 and 804. A Josephson junction 805 is connected between the node 804 and the ground. The sampling clock signal SMP is supplied to the node 804. The output signal Y(z) of the node 804 is fed back as a trigger signal of the feedback driver 802. The feedback driver 802 can output multiple number of flux quanta of $M\times\Phi 0$. The output signal Y(z) triggers two feedback loops: feedback to an integrator of the superconducting inductor L2 and feedback to an integrator of the superconducting inductor L1.

Moreover, in the following Patent Document 1, a second-order sigma-delta modulator is described. However, a method of realizing the second-order sigma delta modulator using superconductivity is not described.

(Non-Patent Document 1)

IEEE Trans. Appl. Supercond., Vol. 3, pp. 2732–2735, March 1993.

(Non-Patent Document 2)

IEEE Trans. Appl. Supercond. Vol. 9, pp. 4026–4029, June 1999.

(Non-Patent Document 3)

IEEE Trans. Appl. Supercond. Vol. 5, pp. 2248–2251, June 1995.

(Non-Patent Document 4)

Technical Report of the Institute of Electronics, Information and Communication Engineers, SCE2003-27, Oct. 17, 2003

(Patent Document 1)

Japanese Patent Publication No. Hei 3-928

(Patent Document 2)

Japanese Patent Application Laid-open No. 2001-102929

The modulator in FIG. 8 needs the feedback driver 802 which feeds back multiple (the number M of) single flux quanta to the second feedback loop. This feedback driver 802 is very difficult to design using the technology of a single flux quantum circuit having small driving force by nature, which becomes a bottleneck in realizing a high-order low-pass sigma-delta modulator.

FIG. 9 is a graph showing a relation between an SN ratio of each type of low-pass sigma-delta modulator and a sampling frequency. The analog signal bandwidth is assumed to be 100 MHz. A curve 901 represents an SN ratio of the superconducting single-loop sigma-delta modulators shown in FIG. 6 and FIG. 7. The SN ratio of the superconducting single-loop sigma-delta modulator coincides with an SN ratio of a model of an ideal first-order sigma-delta modulator. A curve 902 shows an SN ratio calculated from an analytical solution of a transfer function of the superconducting double-loop sigma-delta modulator (M=64) in FIG. 8. A curve 903 shows a curve representing an SN ratio of a model of an ideal second-order sigma-delta modulator. The SN ratio of the superconducting double-loop sigma-delta modulator with the curve 902 does not coincide with the SN ratio of the model of the ideal second-order sigma-delta modulator with the curve 903, and hence it can be seen that although the SN ratio higher than the SN ratio of the superconducting single-loop sigma-delta modulator of the curve 901 can be obtained, the gain M of the feedback driver 802 is considerably high, and that the sufficient SN ratio cannot be achieved unless the sampling frequency is set sufficiently high. In the case of the feedback gain M=64 shown, a circuit scale of several hundred junctions is necessary in order to compose the modulator, whereby not only design but also circuit fabrication is difficult.

SUMMARY OF THE INVENTION

An object of the present invention is to realize a superconducting multi-stage sigma-delta modulator without using a feedback driver.

According to one aspect of the present invention, there is provided a superconducting multi-stage sigma-delta modulator including: a first superconducting sigma-delta modulator having a first integrator and a first comparator and outputting a sigma-delta modulated signal; and a second superconducting sigma-delta modulator having a second integrator and a second comparator and outputting a sigma-delta modulated signal. The first integrator and the second integrator are magnetically coupled.

BRIEF DESCRIPTION OF THE DRAWINGS

FIG. 1 is a circuit diagram showing an example of a superconducting two-stage (second-order) low-pass sigma-delta modulator according to the first embodiment of the present invention;

FIG. 2 is a block diagram showing the principle of a two-stage (second-order) low-pass sigma-delta modulator;

FIG. 3 is a circuit diagram showing an example of a superconducting two-stage (second-order) low-pass sigma-delta modulator according to the second embodiment of the present invention;

FIG. 4 is a circuit diagram showing an example of a superconducting three-stage (third-order) low-pass sigma-delta modulator according to the third embodiment of the present invention;

DETAILED DESCRIPTION OF THE PREFERRED EMBODIMENTS

-First Embodiment-

Figure 5:
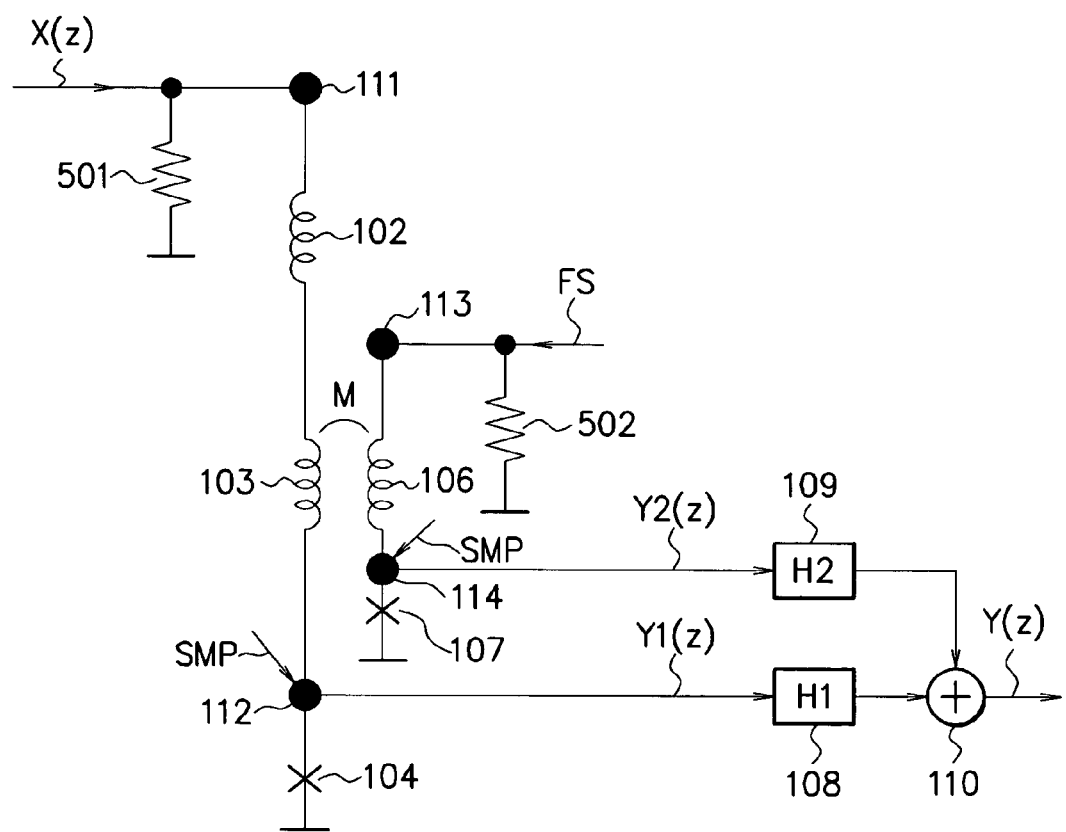
FIG. 5 is a circuit diagram showing an example of a superconducting two-stage (second-order) low-pass sigma-delta modulator according to the fourth embodiment of the present invention.

FIG. 2 shows the principle of a second-order low-pass sigma-delta modulator according to the first embodiment of the present invention. The second-order low-pass sigma-delta modulator includes two first-order low-pass sigma-delta modulators 201 and 211. The second-order sigma-delta modulator modulates an input signal $X(z)$ and outputs an output signal $Y(z)$.

The first-order sigma-delta modulator 201 includes an adder 202, an integrator 203, an analog/digital (A/D) converter 204, and a digital/analog (D/A) converter 205, sigma-delta modulates the input signal $X(z)$, and outputs an output signal $Y1(z)$. The adder 202 subtracts an output signal of the D/A converter 205 from the input signal $X(z)$ and outputs an output signal. The integrator 203 integrates the output signal of the adder 202 and outputs a signal $X2(z)$. The A/D converter 204 converts the signal $X2(z)$ from an analog format to a digital format and outputs the signal $Y1(z)$. The signal $Y1(z)$ contains a quantization error $E1(z)$ caused by the A/D conversion of the A/D converter 204. The D/A converter 205 converts the signal $Y1(z)$ from a digital format to an analog format and feeds it back to the adder 202.

The first-order sigma-delta modulator 211 includes an adder 212, an integrator 213, an A/D converter 214, and a D/A converter 215, sigma-delta modulates the input signal $X2(z)$, and outputs an output signal $Y2(z)$. The adder 212 subtracts an output signal of the D/A converter 215 from the output signal $X2(z)$ of the integrator 203 and outputs an output signal. The integrator 213 integrates the output signal of the adder 212. The A/D converter 214 converts a resultant integrated signal from an analog format to a digital format and outputs the signal $Y2(z)$. The signal $Y2(z)$ contains a quantization error $E2(z)$ caused by the A/D conversion of the A/D converter 214. The D/A converter 215 converts the signal Y2(z) from a digital format to an analog format and feeds it back to the adder 212.

A digital delay 221 has a transfer function H1(z), and a digital differentiator 222 has a transfer function H2(z). An adder 223 adds output signals of the digital delay 221 and the digital differentiator 222 and outputs the output signal Y(z).

The signals Y1(z) and Y2(z) are represented by the following expression:

$$Y1(z)=X(z)+(1-z^{-1})\times E1(z)$$

$$Y2(z)=X2(z)+(1-z^{-1})\times E2(z)$$

where the signal X2(z) is represented by the following expression:

$$X2(z)=Y1(z)-E1(z).$$

The signal Y(z) is represented by the following expression:

$$Y(z)=H1(z)\times Y1(z)+H2(z)\times Y2(z).$$

It has been thought that it is relatively easy to construct the second-order sigma-delta modulator in FIG. 2 by a semiconductor circuit but it is difficult to construct it by a superconducting circuit. In particular, it has been thought difficult to realize a circuit to input the output signal X2(z) of the integrator 203 of the first-stage modulator 201 to the adder 212 of the second-stage modulator 211. Hereinafter, a circuit to realize the second-order sigma-delta modulator will be described using a superconducting circuit.

FIG. 1 shows an example of a superconducting two-stage (second-order) low-pass sigma-delta modulator to realize the second-order low-pass sigma-delta modulator in FIG. 2. An input voltage source 101 is connected between a node 111 and a ground and supplies the input signal X(z). A series-connected circuit of superconducting inductors 102 and 103 is connected between nodes 111 and 112. A series connection of the superconducting inductors 102 and 103 composes a first integrator and has an inductance L1 in total. A Josephson junction 104 is connected between the nodes 112 and the ground and composes a first comparator. When a sampling clock signal SMP is supplied to the node 112, the signal Y1(z) is output from the node 112. The aforementioned superconducting circuit is formed, for example, by a niobium line. The Josephson junction is, for example, a junction formed by providing an aluminum oxide film in a gap in the niobium line.

A voltage source 105 is connected between a node 113 and the ground, and supplies an offset voltage. A superconducting inductor 106 is connected between nodes 113 and 114 and has a self-inductance L2. The superconducting inductors 103 and 106 are magnetically coupled to each other and have a mutual inductance M. The superconducting inductor 106 composes a second integrator. A Josephson junction 107 is connected to the node 114 and the ground and composes a second comparator. When the sampling clock signal SMP is supplied to the node 114, the signal Y2(z) is output from the node 114.

A digital delay 108 corresponds to the digital delay 221 in FIG. 2 and has the transfer function H1(z). A digital differentiator 109 corresponds to the digital differentiator 222 in FIG. 2 and has the transfer function H2(z). An adder 110 corresponds to the adder 223 in FIG. 2, adds output signals of the digital delay 108 and the digital differentiator 109, and outputs the output signal Y(z).

Next, the operation of a first-order sigma-delta modulator including the superconducting inductors 102 and 103 (first integrator) and the Josephson junction 104 (first comparator) will be described. The input voltage source 101 supplies the input signal X(z) to the node 111. The superconducting inductors 102 and 103 compose the first integrator, and a current obtained by integrating the input signal X(z) flows through the superconducting inductors 102 and 103. The Josephson junction 104 composes the first comparator and has a property of outputting a voltage pulse corresponding to a digital value "1" when the current supplied to the node 112 is larger than a threshold and outputting no voltage pulse corresponding to the digital value "0" when the current is smaller than the threshold. A single flux quantum Φ0 is obtained by time-integrating this voltage pulse. The single flux quantum Φ0 is 2.07 fWb and corresponds to a voltage pulse of 2.07 mV·ps. When the Josephson junction 104 outputs the single flux quantum Φ0, the integrated current flowing through the superconducting inductors 102 and 103 is reduced by an amount corresponding to a single flux quantum. By performing such feedback, the sigma-delta modulated signal Y1(z) is output. The Josephson junction 104 performs A/D conversion by quantization in response to the sampling clock signal SMP. The output signal Y1(z) becomes a time series of the digital value "1" and "0".

By the magnetic coupling of the superconducting inductors 103 and 106, an output signal of the superconducting inductors 102 and 103 (first integrator) can be transferred as an input signal of the superconducting inductor 106 (second integrator). The operation of a first-order sigma-delta modulator including the superconducting inductor 106 (second integrator) and the Josephson junction 107 (second comparator) is the same as the above.

The output signal of the integrator of the first-stage first-order sigma-delta modulator is input to the integrator of the second-stage first-order sigma-delta modulator by the magnetic coupling. The output signal Y1(z) of the first-stage modulator is input to the digital delay 108, and the output signal Y2(z) of the second-stage modulator is input to the digital differentiator 109. Their outputs are added by the adder 110 to become the digital output signal Y(z) of the two-stage low-pass sigma-delta modulator.

-Second Embodiment-

FIG. 3 shows an example of a superconducting two-stage (second-order) low-pass sigma-delta modulator according to the second embodiment of the present invention. Similarly to the first embodiment (FIG. 1), this embodiment is also for the purpose of realizing the second-order low-pass sigma-delta modulator in FIG. 2.

An input current source 301 is connected in series to a superconducting inductor 302 and supplies the input signal X(z). A Josephson junction 303 is connected between a node 322 and the ground. A series-connected circuit of superconducting inductors 304 and 305 is connected between nodes 322 and 321. The series-connected circuit of the superconducting inductors 304 and 305 has the self-inductance L1 in total and composes a first integrator. The superconducting inductors 302 and 304 are magnetically coupled to each other and have a mutual inductance M1. Thereby, the input signal X(z) of the input current source 301 is transferred and input to the superconducting inductors (integrator) 304 and 305. A Josephson junction 306 is connected between the node 321 and the ground. An input terminal of a single flux quantum inverter circuit 307 is connected to the node 321 and an output terminal thereof is connected to the node 322. The output signal Y1(z) is output from the node 321. The Josephson junction 306 composes a first comparator. Incidentally, the sampling clock signal SMP is supplied to the Josephson junction 306 and the single flux quantum inverter circuit 307 as in FIG. 1.

A Josephson junction 308 is connected between a node 324 and the ground. A superconducting inductor 309 composes a second integrator, has the self-inductance L2, and is connected between nodes 324 and 323. The superconducting inductors 305 and 309 are magnetically coupled to each other and have a mutual inductance M2. Thereby, an output signal of the superconducting inductors 304 and 305 (first integrator) is transferred and input to the superconducting inductor (second integrator) 309. A Josephson junction 310 is connected between the node 323 and the ground. An input terminal of a single flux quantum inverter circuit 311 is connected to the node 323 and an output terminal thereof is connected to the node 324. The output signal Y2(z) is output from the node 323. The Josephson junction 310 composes a second comparator. Incidentally, the sampling clock signal SMP is supplied to the Josephson junction 310 and the single flux quantum inverter circuit 311.

A digital delay 312 has the transfer function H1(z), and a digital differentiator 313 has the transfer function H2(z). An adder 314 adds output signals of the digital delay 312 and the digital differentiator 313, and outputs the output signal Y(z).

Next, the operation of a first-order sigma-delta modulator including the superconducting inductors 304 and 305, the Josephson junctions 303 and 306, and the single flux quantum inverter circuit 307 will be described. The input signal X(z) of the input current source 301 is supplied to the superconducting inductors 304 and 305 via the mutual inductance M1 from the superconducting inductor 302. The superconducting inductors 304 and 305 compose the first integrator. The Josephson junctions 303 and 306 operate complementarily so as to realize bipolar feedback. For example, if the Josephson junction 306 outputs "0" without outputting the single flux quantum $\Phi 0$ when the input signal X(z) is maintained at 0, the single flux quantum inverter circuit 307 logically inverts an input signal of "0" and outputs the single flux quantum $\Phi 0$, and the Josephson junction 303 outputs the single flux quantum $\Phi 0$. When the Josephson junction 306 outputs the single flux quantum $\Phi 0$, the single flux quantum inverter circuit 307 logically inverts an input signal of the single flux quantum $\Phi 0$ and outputs "0". Then, the Josephson junction 303 outputs nothing. As just described, the Josephson junctions 303 and 306 balance a mean voltage at both ends of the series-connected circuit of the inductors 304 and 305 while maintaining a complementary relationship.

The output signal of the superconducting inductors 304 and 305 (first integrator) can be transferred as an input signal of the superconducting inductor 309 (second integrator) by the magnetic coupling of the superconducting inductors 305 and 309. The operation of a first-order sigma-delta modulator including the superconducting inductor 309, the Josephson junctions 308 and 310, and the single flux quantum inverter circuit 311 is the same as the above.

The signals Y1(z), Y2(z), X2(z), and Y(z) are represented by the following expressions:

$$Y1(z)=X(z)/L1+(1-z^{-1})\times E1(z)$$

$$Y2(z)=X2(z)/L2+(1-z^{-1})\times E2(z)$$

$$X2(z)=M2\times (Y1(z)-E1(z))$$

$$Y(z)=H1(z)\times Y1(z)+H2(z)\times Y2(z)$$

where L1 is the total self-inductance of the superconducting inductors 304 and 305, and L2 is the self-inductance of the superconducting inductor 309.

The transfer function H1(z) of the digital delay 312 and the transfer function H2(z) of the digital differentiator 313 are represented by the following expressions:

$$H1=z^{-1}$$

$$H2=(L2/M2)\times (1-z^{-1})$$

where L2 is the self-inductance of the superconducting inductor 309, and M2 is the mutual inductance of the superconducting inductors 305 and 309.

Then, the signal Y(z) is represented by the following expression:

$$Y(z)=H1(z)\times Y1(z)+H2(z)\times Y2(z)=(X(z)/L1)+(L2/M2)\times (1-z^{-1})^2\times E2(Z)$$

where L1 is the total self-inductance of the series-connected circuit of the superconducting inductors 304 and 305.

Figure 6:
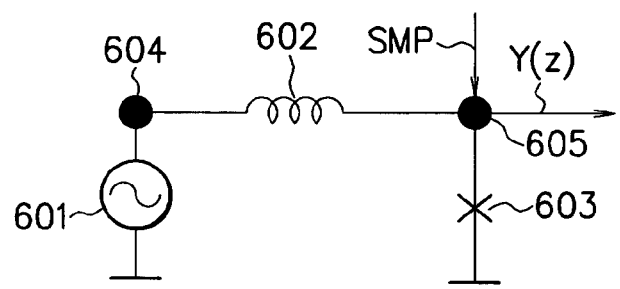
FIG. 6 is a circuit diagram showing a superconducting single-loop sigma-delta modulator.
Figure 7:
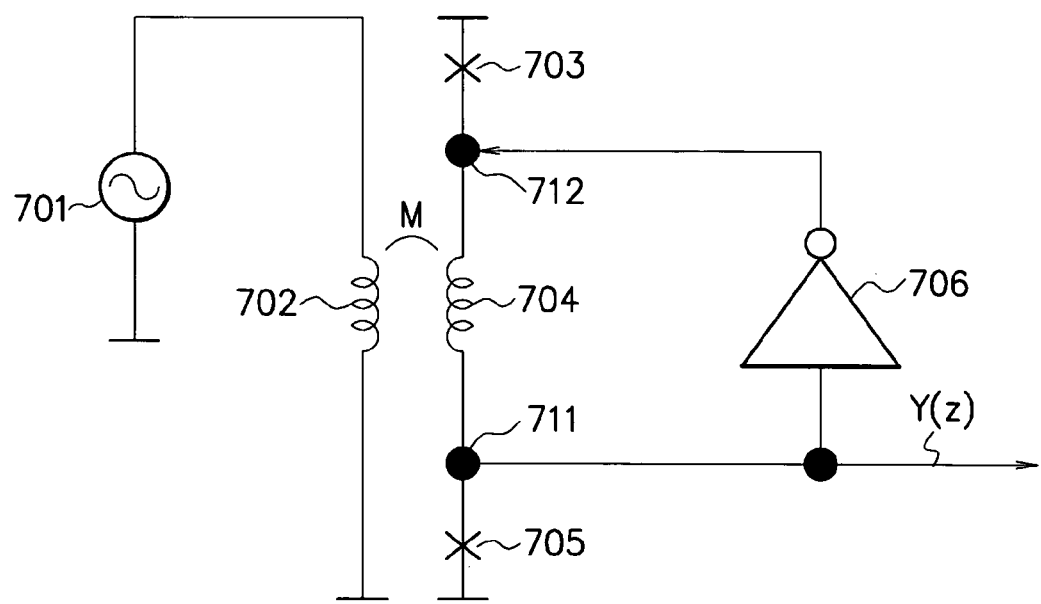
FIG. 7 is a circuit diagram showing another superconducting single-loop sigma-delta modulator.
Figure 9:
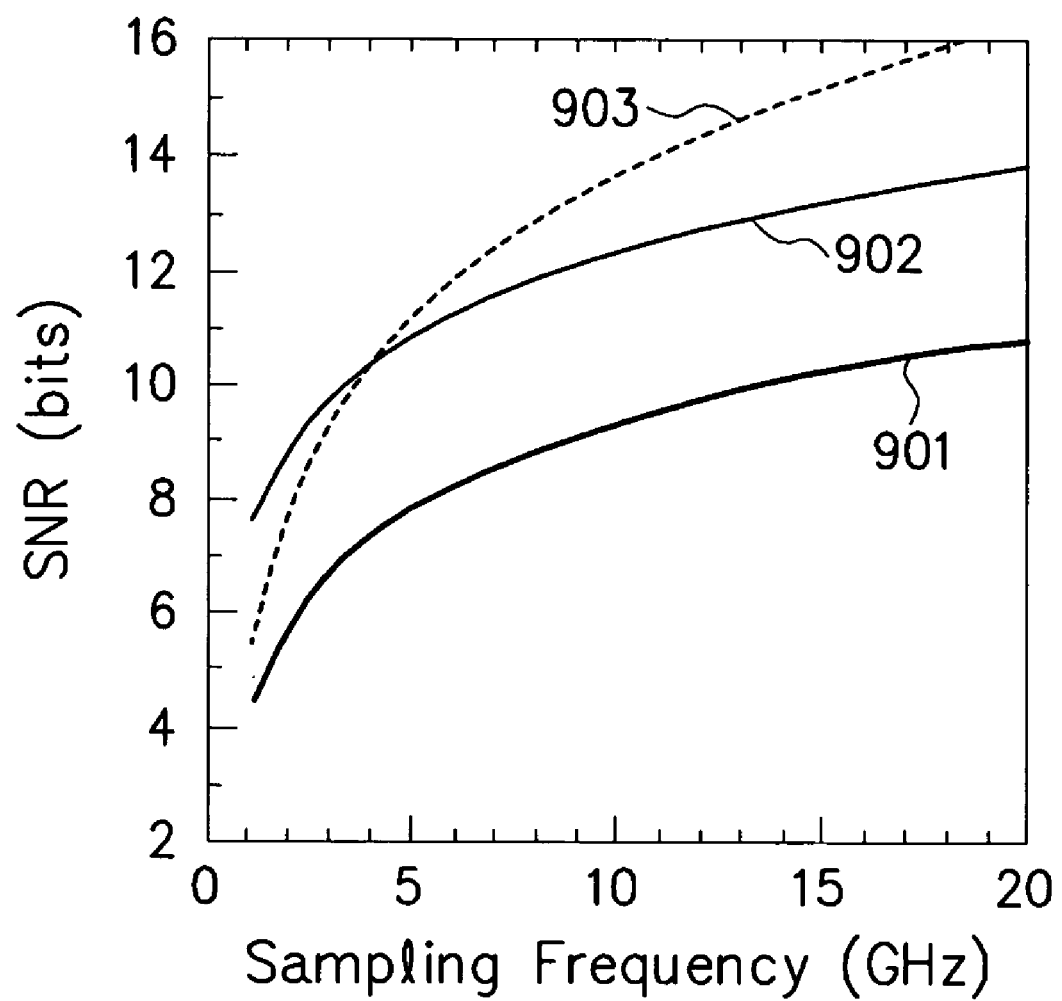
FIG. 9 is a graph showing a relation between an SN ratio of a low-pass sigma-delta modulator and a sampling frequency.

It is worthy of notice that the quantization error E1(z) of the first-stage first-order sigma-delta modulator is cancelled out and eliminated in the output signal Y(z). Consequently, a second-order sigma-delta modulator having a high SN ratio can be realized. This output signal Y(z) has a second-order noise shaping of $(1-z^{-1})^2$ and has a higher SN ratio than a first-order noise shaping of $(1-z^{-1})$ in FIG. 6 and FIG. 7 (See FIG. 9). Moreover, in this embodiment, a characteristic close to an SN ratio curve 903 of an ideal second-order sigma-delta modulator in FIG. 9 can be obtained.

-Third Embodiment-

FIG. 4 is an example of a superconducting three-stage (third-order) low-pass sigma-delta modulator according to the third embodiment of the present invention. This embodiment is basically the same as the second embodiment (FIG. 3), and only different points will be described below. In this embodiment, a third-stage first-order sigma-delta modulator is added to the first-stage first-order sigma-delta modulator and the second-stage first-order sigma-delta modulator in the second embodiment.

A superconducting inductor 400 is connected in series to a superconducting inductor 309. A Josephson junction 401 is connected between a node 412 and the ground. A superconducting inductor 402 composes a third integrator, has a self-inductance L3, and is connected between nodes 412 and 411. The superconducting inductors 400 and 402 are magnetically coupled to each other and have a mutual inductance M3. Thereby, an output signal of a series-connected circuit of the superconducting inductors (second integrator) 309 and 400 is transferred and input to the superconducting inductor (third integrator) 402. A Josephson junction 403 is connected between the node 411 and the ground. An input terminal of a single flux quantum inverter circuit 404 is connected to the node 411, and an output terminal thereof is connected to the node 412. An output signal Y3(z) is output from the node 411. The Josephson junction 403 composes a third comparator. Incidentally, the sampling clock signal SMP is supplied to the Josephson junction 403 and the single flux quantum inverter circuit 404. The aforementioned configuration is the third-stage first-order sigma-delta modulator.

A digital delay 421 has the transfer function H1(z), a digital differentiator 422 has the transfer function H2(z), and a digital differentiator 423 has a transfer function H3(z). An adder 424 adds output signals of the digital delay 421 and the digital differentiators 422 and 423, and outputs the output signal Y(z).

The transfer functions H1(z), H2(z), and H3(z) are represented by the following expressions:

$$H1(z)=(M2/L2) \times z^{-1}$$

$$H2(z)=z^{-1} \times (1-z^{-1})$$

$$H3(z)=(L3/M3) \times (1-z^{-1})^2$$

where L2 is the total self-inductance of the series-connected circuit of the superconducting inductors 309 and 400, M2 is the mutual inductance of the superconducting inductors 305 and 309, L3 is the self-inductance of the superconducting inductor 402, and M3 is the mutual inductance of the superconducting inductors 400 and 402.

Then, the signal Y(z) is represented by the following expression:

$$Y(z)=H1(z) \times Y1(z)+H2(z) \times Y2(z)+H3(z) \times Y3(z)=(M2/L1 \times L2)) \times X(z)+(L3/M3) \times (1-Z^{-1})^3 \times E3(z)$$

where L1 is the total self-inductance of the series-connected circuit of the superconducting inductors 304 and 305, and E3(z) is a quatization error of the third-stage first-order sigma-delta modulator.

The quantization error E1(z) of the first-stage first-order sigma-delta modulator and the quantization error E2(z) of the second-stage first-order sigma-delta modulator are cancelled out and eliminated in the output signal Y(z). This output signal Y(z) has a third-order noise shaping of $(1-Z^{-1})^3$, which can realize the third-order sigma-delta modulator having a high SN ratio.

As described above, by configuring the superconducting low-pass sigma-delta modulator in three stages, the third-order low-pass sigma-delta modulator can be obtained. A fourth or higher order superconducting multi-stage low-pass sigma-delta modulator can be constructed by the same method.

-Fourth Embodiment-

FIG. 5 shows an example of a superconducting two-stage (second-order) low-pass sigma-delta modulator according to the fourth embodiment of the present invention. This embodiment is basically the same as the first embodiment (FIG. 1), and only different points will be described below.

In place of the input voltage source 101 in FIG. 1, a low-value resistance 501 is connected between the node 111 and the ground. The input signal X(z) is input to the resistance 501. The resistance 501 converts the input signal X(z) from current to voltage.

In place of the offset voltage source 105 in FIG. 1, a low-value resistance 502 is connected between the node 113 and the ground. An offset signal FS is input to the resistance 502. The resistance 502 converts the offset signal FS from current to voltage.

As just described, the voltage sources can be composed of the low-value resistances 501 and 502, respectively. Also when the third or higher order sigma-delta modulator is constructed, low-value resistances can be connected in the same manner.

As described above, according to the first to fourth embodiments, in order to realize the multi-stage system requiring no feedback driver which is difficult to design so as to realize a high-order superconducting sigma-delta modulator, an output of the first-stage integrator is input to the second-stage integrator by magnetic coupling. In the case of the second-order sigma-delta modulator, the quantization error (noise) of the first-stage modulator is cancelled out by inputting outputs of the first-stage modulator and the second-stage modulator to the digital delay 108 and the digital differentiator 109 and adding outputs thereof. The superconducting sigma-delta modulator can be used as a front-end circuit of an A/D converting circuit which uses superconducting single flux quantum (SFQ) circuit technology in which a single flux quantum capable of performing high-speed signal processing is used as a carrier of information.

Figure 8:
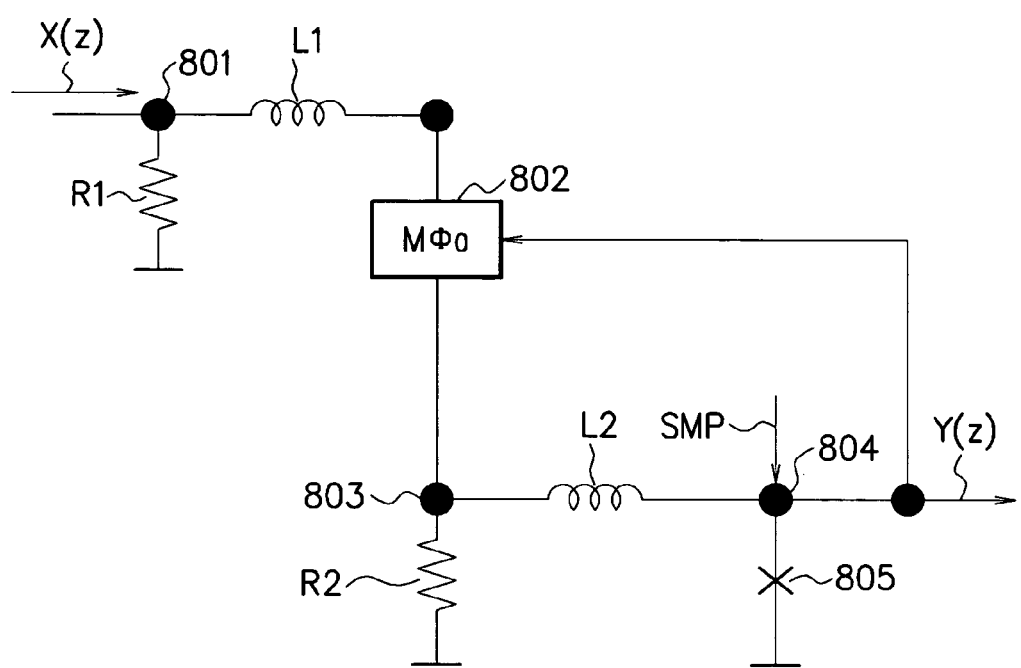
FIG. 8 is a circuit diagram showing a superconducting double-loop sigma-delta modulator.

Second or higher order noise shaping can be obtained without using a feedback driver which is difficult to design, which makes it possible to obtain a high SN ratio without increasing the oversampling ratio considerably. Moreover, a circuit scale of several hundred junctions is needed to construct the double-loop low-pass sigma-delta modulator including the feedback driver 802 in FIG. 8, but in the case of a multi-stage type in this embodiment, the second-order sigma-delta modulator can be constructed only by several tens of junctions.

The present embodiments are to be considered in all respects as illustrative and not restrictive, and all changes which come within the meaning and range of equivalency of the claims are therefore intended to be embraced therein. The invention may be embodied in other specific forms without departing from the spirit or essential characteristics thereof.

By magnetically coupling a first integrator and a second integrator, a superconducting multi-stage sigma-delta modulator can be realized without using a feedback driver. Moreover, an SN ratio close to that of an ideal second or higher order sigma-delta modulator can be realized.

What is claimed is:

1. A superconducting multi-stage sigma-delta modulator, comprising:
    a first superconducting sigma-delta modulator including a first integrator and a first comparator and outputting a sigma-delta modulated signal;
    a second superconducting sigma-delta modulator including a second integrator and a second comparator and outputting a sigma-delta modulated signal; and
    a magnetic coupler magnetically coupling said first integrator and said second integrator.

2. The superconducting multi-stage sigma-delta modulator according to claim 1, wherein
    said first and second integrators each include a superconducting inductor, and
    said first and second comparators each include a Josephson junction.

3. The superconducting multi-stage sigma-delta modulator according to claim 2, wherein
    said first comparator includes a first and second Josephson junctions which are connected in series with the superconducting inductor of said first integrator and a first single flux quantum inverter circuit which is connected between the first and second Josephson junctions,
    the superconducting inductor of said first integrator is connected between the first and second Josephson junctions,
    said second comparator includes a third and fourth Josephson junctions which are connected in series with the superconducting inductor of said second integrator and a second single flux quantum inverter circuit which is connected between the third and fourth Josephson junctions, and
    the superconducting inductor of said second integrator is connected between the third and fourth Josephson junctions.

4. The superconducting multi-stage sigma-delta modulator according to claim 3, further comprising:
a superconducting integrator magnetically coupled to the superconducting inductor of said first integrator and inputting an input signal.

5. The superconducting multi-stage sigma-delta modulator according to claim 4, wherein said magnetic coupler includes a superconducting inductor which is connected in series to the superconducting inductor of said first integrator and magnetically coupled to the superconducting inductor of said second integrator.

6. The superconducting multi-stage sigma-delta modulator according to claim 5, further comprising:
a first digital filter filtering the output signal of said first superconducting sigma-delta modulator;
a second digital filter filtering the output signal of said second superconducting sigma-delta modulator; and
an adder adding at least two signals filtered by said first and second digital filters.

7. The superconducting multi-stage sigma-delta modulator according to claim 3, wherein said magnetic coupler includes a superconducting inductor which is connected in series to the superconducting inductor of said first integrator and magnetically coupled to the superconducting inductor of said second integrator.

8. The superconducting multi-stage sigma-delta modulator according to claim 3, further comprising:
a first digital filter filtering the output signal of said first superconducting sigma-delta modulator;
a second digital filter filtering the output signal of said second superconducting sigma-delta modulator; and
an adder adding at least two signals filtered by said first and second digital filters.

9. The superconducting multi-stage sigma-delta modulator according to claim 2, wherein the superconducting inductor of said first integrator and the Josephson junction of said first comparator are connected in series, and the superconducting inductor of said second integrator and the Josephson junction of said second comparator are connected in series.

10. The superconducting multi-stage sigma-delta modulator according to claim 9, wherein said magnetic coupler includes a superconducting inductor which is connected in series to the superconducting inductor of said first integrator and magnetically coupled to the superconducting inductor of said second integrator.

11. The superconducting multi-stage sigma-delta modulator according to claim 10, further comprising:
a first digital filter filtering the output signal of said first superconducting sigma-delta modulator;
a second digital filter filtering the output signal of said second superconducting sigma-delta modulator; and
an adder adding at least two signals filtered by said first and second digital filters.

12. The superconducting multi-stage sigma-delta modulator according to claim 9, further comprising:
a resistance connected to the superconducting inductor of said first integrator and converting an input current to a voltage.

13. The superconducting multi-stage sigma-delta modulator according to claim 1, further comprising:
a resistance connected to said first integrator and converting an input current to a voltage.

14. The superconducting multi-stage sigma-delta modulator according to claim 13, wherein said magnetic coupler includes a superconducting inductor which is connected in series to the superconducting inductor of said first integrator and magnetically coupled to the superconducting inductor of said second integrator.

15. The superconducting multi-stage sigma-delta modulator according to claim 14, further comprising:
a first digital filter filtering the output signal of said first superconducting sigma-delta modulator;
a second digital filter filtering the output signal of said second superconducting sigma-delta modulator; and
an adder adding at least two signals filtered by said first and second digital filters.

16. The superconducting multi-stage sigma-delta modulator according to claim 1, further comprising:
a digital delay delaying the output signal of said first superconducting sigma-delta modulator;
a digital differentiator differentiating the output signal of said second superconducting sigma-delta modulator; and
an adder adding an output signal of said digital delay and an output signal of said digital differentiator.

17. The superconducting multi-stage sigma-delta modulator according to claim 1, wherein said magnetic coupler includes a superconducting inductor magnetically coupling said first integrator and said second integrator.

18. The superconducting multi-stage sigma-delta modulator according to claim 1, wherein said first and second integrators each include a superconducting inductor.

19. The superconducting multi-stage sigma-delta modulator according to claim 1, wherein said first and second comparators each include a Josephson junction.

20. The superconducting multi-stage sigma-delta modulator according to claim 1, further comprising:
a first digital filter filtering the output signal of said first superconducting sigma-delta modulator;
a second digital filter filtering the output signal of said second superconducting sigma-delta modulator; and
an adder adding at least two signals filtered by said first and second digital filters.

* * * * *

UNITED STATES PATENT AND TRADEMARK OFFICE
CERTIFICATE OF CORRECTION

| | |
|---|---|
| PATENT NO. | : 7,038,604 B2 |
| APPLICATION NO. | : 11/128339 |
| DATED | : May 2, 2006 |
| INVENTOR(S) | : Hirano et al. |

It is certified that error appears in the above-identified patent and that said Letters Patent is hereby corrected as shown below:

<u>Title Page</u> -

In (73) Assignee Information, please add a second Assignee's name and address as follows:

-- International Superconductivity Technology Center, The Juridical Foundation, Tokyo (JP) --.

Signed and Sealed this

Eighteenth Day of September, 2007

JON W. DUDAS
*Director of the United States Patent and Trademark Office*